(12) United States Patent
Nakamura

(10) Patent No.: US 8,603,856 B2
(45) Date of Patent: Dec. 10, 2013

(54) ORGANIC TRANSISTOR AND METHOD FOR MANUFACTURING THE SAME

(75) Inventor: Kiyoshi Nakamura, Suwa-gun (JP)

(73) Assignee: Seiko Eposon Corporation, Tokyo (JP)

( * ) Notice: Subject to any disclaimer, the term of this patent is extended or adjusted under 35 U.S.C. 154(b) by 267 days.

(21) Appl. No.: 13/090,650

(22) Filed: Apr. 20, 2011

(65) Prior Publication Data

US 2011/0260249 A1     Oct. 27, 2011

(30) Foreign Application Priority Data

Apr. 23, 2010   (JP) ................. 2010-100172

(51) Int. Cl.
*H01L 51/40*     (2006.01)
(52) U.S. Cl.
USPC ............ 438/99; 438/151; 257/E51.005
(58) Field of Classification Search
USPC ............ 257/40, E51.005; 438/99, 151
See application file for complete search history.

(56) References Cited

U.S. PATENT DOCUMENTS

2008/0237581 A1* 10/2008 Wu et al. .................... 257/40
2012/0077308 A1*  3/2012 Sydorenko et al. .......... 438/99

FOREIGN PATENT DOCUMENTS

JP   A-2005-217359   8/2005
JP   A-2009-072654   4/2009

OTHER PUBLICATIONS

Lu et al; Low-voltage organic transistors with titatinum oxide/polystyrene bilayer dielectrics; Mar. 19, 2009; Applied Physics Letters 94 113303-1-113303-3.*
Yoon et al.; Gate Dielectric Chemical Structure-Organic Field-Effect Transistor Performance Correlations for Electron, Hole, and Ambipolar Organic Semiconductors; Sep. 6, 2009; Journal Americal Chemical Society. 2006, 128, 12851-12869.*

* cited by examiner

*Primary Examiner* — Colleen Matthews
(74) *Attorney, Agent, or Firm* — Oliff & Berridge, PLC

(57) ABSTRACT

An organic transistor includes an insulating substrate, a gate electrode on the substrate, a gate insulating layer disposed over the substrate and the gate electrode, a source and a drain electrode on the gate insulating layer, a nonpolar macromolecular insulating underlayer disposed on the gate insulating layer at least between the source electrode and the drain electrode, and an organic semiconductor layer disposed on the source electrode and the drain electrode and on the insulating underlayer between the source electrode and the drain electrode.

5 Claims, 3 Drawing Sheets

ORGANIC TRANSISTOR AND METHOD FOR MANUFACTURING THE SAME

CROSS-REFERENCE TO RELATED APPLICATION

This application is based on and claims priority from Japanese Patent Application No. 2010-100172, filed on Apr. 23, 2010, the contents of which are incorporated herein by reference.

BACKGROUND

1. Technical Field

The present invention relates to an organic transistor manufactured using a liquid semiconductor material and a method for manufacturing the organic transistor.

2. Related Art

Organic semiconductors have lower intermolecular binding energies than inorganic semiconductors, and accordingly can form films in low-energy processes. In particular, a solution of an organic semiconductor material in a solvent can be used for forming a semiconductor element by a known printing technique, such as an ink jet method, and the process using such an organic semiconductor material solution has received attention as a new low-energy, low-cost, high-throughput semiconductor process. For example, JP-A-2009-72654 discloses that a film pattern of a semiconductor device is formed by an ink jet method. JP-A-2005-217359 discloses another semiconductor process using a liquid material. In this process, an insulating film is partially dissolved by being coated with a liquid material containing a solvent, and the solute in the liquid material forms another electroconductive film.

While the substrates of transistors and ICs are typically made of silicon or glass, processes for forming a transistor using a flexible plastic substrate (made of, for example, polyimide, polyethylene naphthalate or polyethylene terephthalate), an organic semiconductor material, a conductive macromolecular material or an insulating macromolecular material has been studied to achieve a flexible semiconductor device.

Some of the plastics and macromolecular materials contain polar functional groups. If a material having a polar functional group is present in the vicinity of the transistor channel, the characteristics of the transistor may be affected by the polar group. Particularly when the gate insulating layer or the substrate adjacent to the channel of the transistor contains a material (polar material) having a polar functional group, the characteristics (threshold voltage, off current, etc.) are liable to be affected by the polar group. Even if the gate insulating layer is made of a non-macromolecular material, such as silicon oxide, the gate insulating layer contains polar molecules having a polar group, such as hydroxy group —OH, which has penetrated from the atmosphere used in the process. The characteristics of the transistor are affected by polar molecules or a polar substance present in the vicinity of the channel.

SUMMARY

An advantage of some aspects of the invention is that it provides a transistor whose channel is not affected by a polar substance present in the substrate or insulating film of the transistor, and a method for manufacturing the transistor.

According to an aspect of the invention, an organic transistor is provided which includes an insulating substrate, a gate electrode on the substrate, a gate insulating layer disposed over the substrate and the gate electrode, a source and a drain electrode on the gate insulating layer, a nonpolar macromolecular insulating underlayer disposed on the gate insulating layer at least between the source electrode and the drain electrode, and an organic semiconductor layer disposed on the source electrode and the drain electrode and on the insulating underlayer between the source electrode and the drain electrode.

The nonpolar macromolecular insulating underlayer formed on the gate insulating layer in the channel region alleviates the negative effect of the underlying layer, such as the gate insulating layer, of the transistor characteristics. For example, even if polar molecules are present at the surface of the gate insulating layer, the variations in threshold voltage and on-current of the transistor can be reduced.

The polar molecule mentioned herein refers to a molecule having an electrical polarization in the structure, and the nonpolar molecule mentioned herein refers to a molecule not having an electrical polarization in the structure.

According to another aspect of the invention, an organic transistor includes an insulating substrate, a source and a drain electrode on the substrate, a nonpolar macromolecular insulating underlayer disposed on the substrate at least between the source electrode and the drain electrode, an organic semiconductor layer disposed on the source electrode and the drain electrode and on the insulating underlayer between the source electrode and the drain electrode, a gate insulating layer over the organic semiconductor layer, and a gate electrode disposed on the gate insulating layer corresponding to the region between the source electrode and the drain electrode.

In this structure, the nonpolar macromolecular insulating underlayer alleviates the negative effect of the underlying substrate on the transistor characteristics. For example, even if polar molecules are present at the surface of the substrate, the variations in threshold voltage and on-current of the transistor can be reduced.

According to still another aspect of the invention, a method is provided for manufacturing an organic transistor. In the method, a gate electrode is formed on an insulating substrate. A gate insulating layer is formed over the substrate and the gate electrode. A source electrode and a drain electrode are formed on the gate insulating layer. A nonpolar macromolecular insulating underlayer is formed over the gate insulating layer, the source electrode and the drain electrode. An organic semiconductor layer is formed between the source electrode and the drain electrode by applying an organic semiconductor material solution onto the source electrode and the drain electrode and between the source electrode and the drain electrode. The organic semiconductor material solution contains a solvent that can dissolve the nonpolar macromolecular insulating underlayer.

In this method, an organic semiconductor layer can be formed between the source electrode and the drain electrode (in the channel region) without etching the insulating underlayer in another process step. In this instance, when the gate insulating layer has a higher surface roughness than the source electrode and the drain electrode, the nonpolar macromolecular insulating underlayer is bound to the gate insulating layer more firmly than to the electrodes, so that the portions of the insulating underlayer on the electrodes are removed by the solvent in the organic semiconductor material solution and the portion of the insulating underlayer on the gate insulating layer (channel region) remains. The insulating underlayer (nonpolar macromolecular layer) remaining in the channel region functions to stabilize the characteristics of the channel (transistor).

By reducing the surface free energy of the insulating underlayer, the insulating underlayer can repel the organic semiconductor material solution and is accordingly prevented from spreading. Consequently, a thick organic semiconductor layer can be formed.

Preferably, the method further includes performing surface treatment to impart different surface roughnesses to the gate insulating layer and the source and drain electrodes (or to roughen the surface of the gate insulating layer) so that the solvent can remove the portions of the nonpolar macromolecular insulating underlayer on the source and drain electrodes and allow the portion of the insulating underlayer between the source electrode and the drain electrode to remain, subsequent to the formation of the source and drain electrodes. Consequently, the organic semiconductor layer can be formed on the insulating underlayer (nonpolar macromolecular layer) remaining in the channel region, removed from the source and drain electrodes. The nonpolar macromolecular insulating underlayer functions to stabilize the characteristics of the channel (transistor).

According to still another aspect of the invention, a method is provided for manufacturing an organic transistor. In the method, a source electrode and a drain electrode are formed on an insulating substrate. A nonpolar macromolecular insulating underlayer is formed over the substrate and the source and drain electrodes. An organic semiconductor layer is formed between the source electrode and the drain electrode by applying an organic semiconductor material solution onto the source electrode and the drain electrode and between the source electrode and the drain electrode. The organic semiconductor material solution contains a solvent that can dissolve the nonpolar macromolecular insulating underlayer. A gate insulating layer is formed over the insulating underlayer and the organic semiconductor layer. A gate electrode is formed on the gate insulating layer corresponding to the region between the source electrode and the drain electrode.

In this method, an organic semiconductor layer can be formed in the channel region without etching the insulating underlayer in another process step. In this instance, when the substrate has a higher surface roughness than the source electrode and the drain electrode, the nonpolar macromolecular insulating underlayer is bound to the substrate more firmly than to the electrodes, so that the portions of the insulating underlayer on the electrodes are removed by the solvent in the organic semiconductor material solution and the portion of the insulating underlayer on the substrate (channel region) remains. The insulating underlayer (nonpolar macromolecular layer) remaining in the channel region functions to stabilize the characteristics of the channel (transistor).

By imparting a liquid repellency to the surface of the insulating underlayer so as to repel the organic semiconductor material solution, the organic semiconductor material solution can be prevented from spreading, and thus can form a thick organic semiconductor layer.

Preferably, the method further includes performing surface treatment to impart different surface roughnesses to the substrate and the source and drain electrodes (or to roughen the surface of the substrate) so that the solvent can remove the portions of the nonpolar macromolecular insulating underlayer on the source and drain electrodes and allow the portion of the insulating underlayer between the source electrode and the drain electrode to remain, subsequent to the formation of the source and drain electrodes. Consequently, the organic semiconductor layer can be formed on the insulating underlayer (nonpolar macromolecular layer) remaining in the channel region, removed from the source and drain electrodes.

Preferably, the insulating underlayer has a thickness of 100 nm or less, and more preferably of several nanometers to several tens of nanometers. Such an insulating underlayer can function as intended, while the negative effect on the transistor characteristics is reduced.

Preferably, the materials are selected so that the insulating underlayer can repel the organic semiconductor material solution. Consequently, the organic semiconductor layer can be formed with a large thickness. The organic semiconductor material solution may be replaced with liquid silicon.

A material that can function in the same manner as the nonpolar macromolecular material may be used for the insulating underlayer. One of such materials is a fluorocarbon polymer. Fluorocarbons have polar groups, but their molecules are not electrically polarized. Fluorocarbons therefore do not seriously affect the characteristics of the organic transistor. Also, fluorocarbons can form an insulating underlayer having a low surface free energy (having a liquid-repellent surface).

Preferably, the organic semiconductor material solution or the liquid silicon is applied by an ink jet method (liquid ejecting method).

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
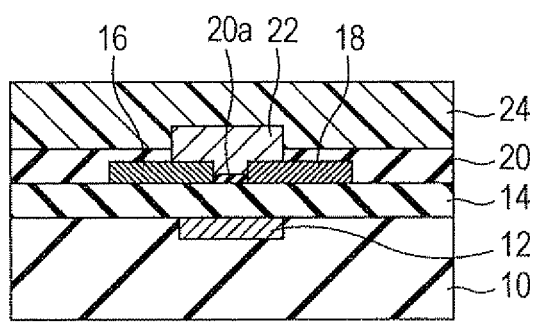
FIGS. 1A and 1B are representations of the structures of organic transistors according to different embodiments of the invention.
Figure 1B:
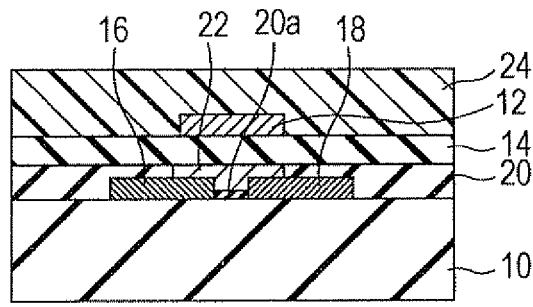

Exemplary embodiments of the invention will now be described with reference to FIGS. 1A to 3G. FIGS. 1A and 1B show the structures of transistors according to different embodiments of the invention. FIGS. 2A to 2G and 3A to 3G show processes for manufacturing a transistor according to different embodiments. In the drawings, the same parts are designated by the same reference numerals and the same description may be omitted as appropriate.

In the embodiments of the invention, an insulating underlayer made of a macromolecular thin film mainly containing a nonpolar group is provided in the channel region in order to reduce the negative effect of polar molecules in or at the surface of the gate insulating layer or substrate in contact with the semiconductor layer. In addition, the insulating underlayer surrounds the channel region (source electrode, semiconductor layer, and drain electrode) of the transistor to prevent polar substances from coming close to the channel. Thus, the negative effect of the polar molecules is alleviated. A liquid semiconductor material is used to form the insulating underlayer. A semiconductor solution dissolves the insulating underlayer to electrically connect the semiconductor layer and the electrodes below the semiconductor layer. In this process, by controlling the wettability between the semiconductor solution and the insulating underlayer, the formation of the semiconductor layer can be appropriately controlled so that the insulating underlayer repels the semiconductor solution to suppress the wetting and spreading of the solution and allows the semiconductor layer to be formed with a large thickness.

FIG. 1A shows a bottom-gate bottom-contact thin film transistor (TFT) according to a first embodiment of the invention. For the sake of convenience and easy illustration, the dimensional proportions of the layers and other members differ in the figure, and the same applies to the other figures.

As shown in FIG. 1A, the transistor includes an insulating substrate 10, a gate electrode 12, a gate insulating layer 14, a source electrode 16, a drain electrode 18, insulating underlayers 20 and 20a, a semiconductor layer 22, and an insulating protective layer 24.

As will be described below, the insulating substrate 10 may be made of a plastic, glass, quartz, or silicon (or SOI, silicon on insulator). The gate electrode 12, the source electrode 16 and the drain electrode 18 may be made of gold or other metals. The gate insulating layer 14 can be made of silicon oxide or an insulating macromolecular material. The insulating underlayers 20 and 20a are made of an insulating macromolecular material having a nonpolar group, such as polyethylene, which will be described later. The semiconductor layer 22 is made of a liquid semiconductor material. For example, a solution of an organic semiconductor material such as poly-N-carbazole or of silicon may be used. The protective layer 24 is made of an insulating macromolecular material, such as polymethyl methacrylate (PMMA). The materials of the other members can be appropriately selected according to the conditions of the manufacturing process and desired properties.

In the structure of the first embodiment shown in FIG. 1A, the source electrode 16 and the drain electrode 18 are disposed apart from each other on the gate insulating layer 14. A thin film (several nanometers to several tens of nanometers) of the insulating underlayer 20a is disposed in the channel region between the source electrode 16 and the drain electrode 18 on the gate insulating layer 14. The semiconductor layer 22 is disposed on the insulating underlayer 20a so as to extend to the top surfaces of the source electrode 16 and the drain electrode 18.

The insulating underlayer 20a is an insulating macromolecular film mainly containing a nonpolar group, disposed between the gate insulating layer 14 and the semiconductor layer 22 in the channel region, and alleviates the negative effect of polar groups such as the hydroxy group (—OH) or polar molecules present at the surface of the gate insulating layer 14.

As shown in FIG. 1A, the insulating underlayers 20 and 20a surround the source electrode 16, the semiconductor layer 22 and the drain electrode 18 to prevent polar molecules from coming close to the channel of the semiconductor layer 22.

The nonpolar macromolecular film of the insulating underlayer 20 has water repellency or liquid repellency, as described later, so that the liquid semiconductor material can be deposited with a large thickness in the channel region by, for example, an ink jet method and thus can form a thick semiconductor layer 22.

FIG. 1B shows a top-gate bottom-contact thin film transistor (TFT) according to a second embodiment of the invention. In this embodiment as well as in the first embodiment, the transistor includes an insulating substrate 10, a gate electrode 12, a gate insulating layer 14, a source electrode 16, a drain electrode 18, insulating underlayers 20 and 20a, a semiconductor layer 22, and an insulating protective layer 24.

In the second embodiment, the insulating underlayer 20a is disposed between the substrate 10 and the semiconductor layer 22 in the channel region to alleviate the negative effect of polar groups such as the hydroxy group (—OH) or polar molecules present at the surface of the substrate 10. The nonpolar macromolecular film of the insulating underlayer 20 has water repellency or liquid repellency so that the liquid semiconductor material can be deposited with a large thickness in the channel region by, for example, an ink jet method and thus can form a thick semiconductor layer 22.

As shown in FIG. 1B, the insulating underlayers 20 and 20a surround the source electrode 16, the semiconductor layer 22 and the drain electrode 18 to prevent polar molecules from coming close to the channel of the semiconductor layer 22.

Method for Manufacturing the Transistor of the First Embodiment

FIGS. 2A to 2G are representations showing a manufacturing process of the transistor shown in FIG. 1A.

Forming Gate Electrode

Figure 2A:
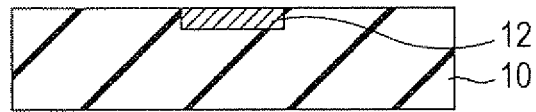
FIGS. 2A to 2G are representations showing a process for manufacturing an organic transistor according to an embodiment of the invention.

As shown in FIG. 2A, a gate electrode 12 and its wiring are formed on an insulating substrate 10.

For example, the gate electrode is formed by depositing gold to a thickness of about 10 nm to several micrometers on the substrate 10 and patterning the gold film. If the gate electrode 12 is formed so as to be flush with the surface of the substrate 10, as shown in FIG. 2A, a metal such as gold may be deposited in a groove formed in the substrate 10 by sputtering or vapor deposition, or a metal solution may be applied in the groove and then heat-treated to form a metal film. Then, the metal film is planarized by chemical mechanical polishing (CMP).

The substrate may be a plastic, glass, quartz, or silicon substrate.

If a plastic substrate is used, the plastic may be a thermoplastic resin or a thermosetting resin. Examples of the material of the plastic substrate include polyethylene, polypropylene, ethylene-propylene copolymer, ethylene-vinyl acetate copolymer (EVA) and other polyolefins, cyclic polyolefins and modified polyolefins; polyvinyl chloride; polyvinylidene chloride; polystyrene; polyamide; polyimide; polyamide-imide; polycarbonate; poly-(4-methylpenten-1); ionomers; acrylic resins; polymethyl methacrylate; acrylic-styrene copolymers (AS resins); butadiene-styrene copolymers; ethylene-vinylalcohol copolymer (such as EVOH); polyesters, such as polyethylene terephthalate, polybutylene terephthalate, polyethylene naphthalate and polycyclohexane terephthalate (PCT); polyether; polyether ketone; polyether ether ketone); polyether imide; polyacetal; polyphenylene oxide; modified polyphenylene oxide; polyacrylate; aromatic polyesters (liquid crystal polymers);

polytetrafluoroethylene, polyvinylidene fluoride and other fluorocarbon resins; thermoplastic elastomers, such as those of styrene, polyolefin, polyvinyl chloride, polyurethane, fluorocarbon rubber and chloropolyethylene; epoxy resins; phenol resins; urea resins; melamine resins; unsaturated polyesters; silicone resins; and polyurethane. Copolymers, blended forms, and polymer alloys of these plastics may also be used, and composites including layers of these plastics may be used.

Forming Gate Insulating Layer

Figure 2B:
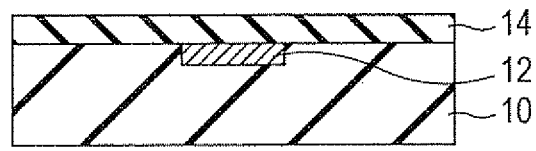

As shown in FIG. 2B, a gate insulating layer 14 is formed over the substrate 10 and the gate electrode 12. For example, a silicon oxide film is formed to a thickness of about 100 nm to several micrometers by chemical vapor deposition (CVD)

of a silicon-based compound gas. The gate insulating layer may be formed of tetraethoxysilane (TEOS) or the like by plasma-enhanced chemical vapor deposition (PE-CVD). Organic insulating materials such as polyvinyl alcohol (PVA) may be used for the gate insulating layer.

Exemplary organic insulating materials include polyolefins, such as polyethylene, polypropylene, polybutylene and polystyrene, cyclic olefins, polyvinyl alcohol, polymethyl methacrylate, polyimide, polyvinylphenol, polycarbonate, and parylene. These materials may be used singly or in combination.

Forming Source and Drain Electrodes

Figure 2C:
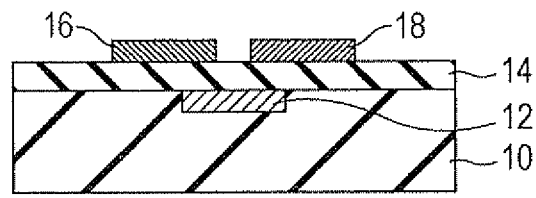

As shown in FIG. 2C, a source electrode 16, a drain electrode 18 and their wiring (not shown) are formed on the gate insulating layer 14. For example, a gold film is vapor-deposited on the gate insulating layer 14. The gold film is patterned into a shape corresponding to the source electrode, the drain electrode and their wiring, and thus the source and drain electrodes 16 and 18 of about 10 nm to several micrometers in thickness are formed.

Surface Treatment

The substrate 10 on which the source electrode 16 and the drain electrode 18 are disposed is washed with water and an organic solvent, and is subsequently subjected to surface treatment with oxygen plasma. Organic matter on the surfaces of the electrodes is removed by this surface treatment. The conditions of the surface treatment are controlled so that the gate insulating layer 14 (more preferably, the portion of the gate insulating layer 14 in the channel region) has a higher surface roughness than the source and drain electrodes 16 and 18. Consequently, it becomes easy to bind an insulating underlayer formed in a subsequent operation to the surface of the gate insulating layer 14.

Forming Insulating Underlayer

Figure 2D:
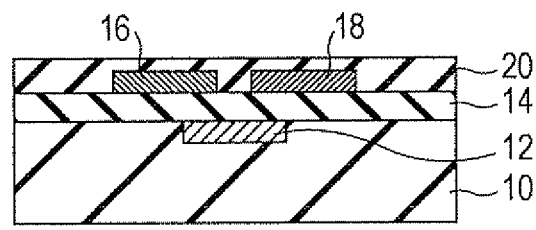

As shown in FIG. 2D, a nonpolar macromolecular material is dissolved in a solvent, and the nonpolar macromolecular solution is applied onto the gate insulating layer 14, the source electrode 16 and the drain electrode 18 by spin coating, followed by drying. The insulating underlayer 20 is thus formed. The thickness of the insulating underlayer 20 is several nanometers to several hundreds of nanometers, and preferably several nanometers to 50 nm.

Preferably, the insulating underlayer is made of a macromolecular material mainly containing a nonpolar group ($CH_3$, $CH_3CH_2$, or benzene ring), such as polyethylene, polypropylene, polybutylene, polystyrene or other polyolefins, or a cyclic olefin.

The solvent of the macromolecular material may be appropriately selected from among toluene, xylene, trimethylbenzene, cyclohexylbenzene, cyclohexane, tetralin, decahydronaphthalene, decane, dodecane, y-butyrolactone and so forth.

By selecting a polymer having a lower surface free energy from the macromolecular materials mainly containing a nonpolar group, the organic semiconductor material solution (organic semiconductor ink) used for forming the organic semiconductor layer can be prevented from spreading when it is applied by an ink jet method described below.

Applying Organic Semiconductor Material

Figure 2E:
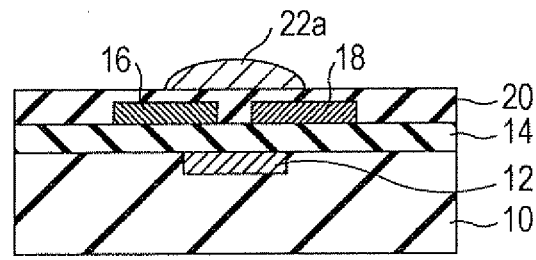

As shown in FIG. 2E, an organic semiconductor material solution 22a is applied to the channel region on the insulating underlayer 20 by an ink jet method. The organic semiconductor material solution 22a is deposited so as to overlap with the source electrode 16 and the drain electrode 18 when viewed from above. Since the insulating underlayer 20 is liquid-repellent, the organic semiconductor material solution 22a can be deposited with a large thickness.

The organic semiconductor material solution 22a contains an organic semiconductor material. Examples of the organic semiconductor material include, but are not limited to, macromolecules, such as poly-N-vinyl carbazole, polyvinyl pyrene, polyvinyl anthracene, polythiophene, polyhexylthiophene, poly(p-phenylene vinylene), polyphenylene vinylene, polyarylamine, pyrene formaldehyde resin, ethylcarbazole formaldehyde resin, fluorene-bithiophene copolymer, fluorene-arylamine copolymer, and their derivatives; and low-molecular-weight organic semiconductors, such as naphthalene, anthracene, tetracene, pentacene, hexacene, phthalocyanine, perylene, hydrazone, triphenylmethane, diphenylmethane, stilbene, aryl vinyls, pyrazoline, triphenylamine, triarylamines, oligothiophene, phthalocyanine, and their derivative. These organic semiconductor materials may be used singly or in combination.

The organic semiconductor material is dissolved in a solvent. Examples of the solvent include toluene, xylene, trimethylbenzene, cyclohexylbenzene, cyclohexane, tetralin, decahydronaphthalene, decane, dodecane, and γ-butyrolactone. The solvent is not particularly limited as long as it can dissolve not only the organic semiconductor material, but also the insulating underlayer 20.

Forming Organic Semiconductor Layer

Figure 2F:
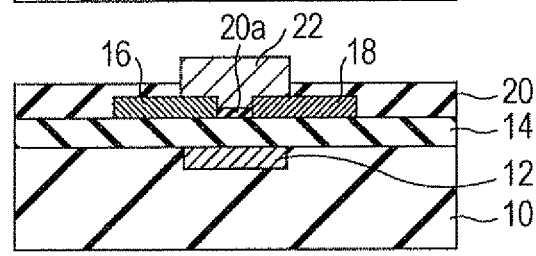

As shown in FIG. 2F, the insulating underlayer 20 is dissolved by the solvent of the organic semiconductor material solution 22a, and the weakly bound portions of the insulating underlayer 20 on the source and drain electrodes 16 and 18 are removed. Thus, the organic semiconductor material solution 22a comes into direct contact with the source electrode 16 and the drain electrode 18. Since the portion of the insulating underlayer 20 in the channel region between the source electrode 16 and the drain electrode 18 is firmly bound with the gate insulating layer 20, this portion remains as an insulating underlayer 20a, The organic semiconductor material solution 22a is dried to be solidified, thus forming the organic semiconductor layer 22. The organic semiconductor layer 22 overlaps with the source electrode 16 and the drain electrode 18, and fills the channel region over the insulating underlayer 20a between the source and drain electrodes 16 and 18. The thickness of the organic semiconductor layer 22 is several nanometers to several hundreds of nanometers. Preferably, it is about several tens of nanometers to 100 nm.

Forming Protective Layer

Figure 2G:
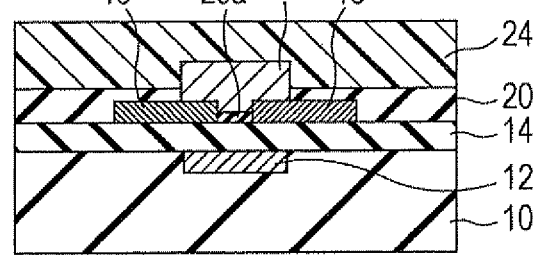

As shown in FIG. 2G, a protective layer 24 is formed of an organic insulating material such as polymethyl methacrylate resin (PMMA) over the insulating underlayer 20 and the semiconductor layer 22 by spin coating, and thus a transistor is completed.

By use of a solution of a semiconductor material, the insulating underlayer 20 can be removed without etching being performed in another process step, and an organic semiconductor layer 22 can be formed between the source electrode 16 and the drain electrode 18 (in the channel region). In this operation, the insulating underlayer 20a, that is, the portion of the insulating underlayer 20 on the gate insulating layer 14 (in the channel region), remains because the gate insulating layer 14 has a rough surface. The insulating underlayer (nonpolar macromolecular layer) 20a remaining in the channel region functions to stabilize the characteristics of the channel (transistor). Also, since the material of the insulating underlayer 20 is selected so that the surface of the insulating underlayer repels the organic semiconductor material solution 22a, the spreading of the organic semiconductor material solution 22a can be suppressed, and accordingly, the organic semiconductor layer 22 can be formed with a large thickness.

Method for Manufacturing the Transistor of the Second Embodiment

FIGS. 3A to 3G are representations showing a manufacturing process of the transistor shown in FIG. 1B. In these figures, the same parts as in FIGS. 2A to 2G are designated by the same reference numerals.

Forming Source and Drain Electrodes

Figure 3A:
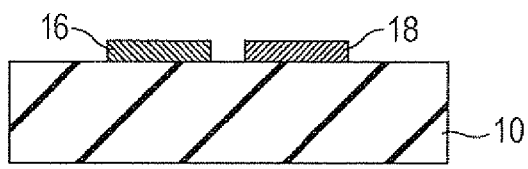
FIGS. 3A to 3G are representations showing a process for manufacturing an organic transistor according to another embodiment of the invention.

As shown in FIG. 3A, a source electrode 16, a drain electrode 18 and their wiring (not shown) are formed on an insulating substrate 10. For example, a gold film is vapor-deposited onto the substrate 10. The gold film is patterned into a shape corresponding to the source electrode, the drain electrode and their wiring, and thus the source and drain electrodes 16 and 18 of about 10 nm to several micrometers in thickness are formed. As described above, the substrate 10 may be a plastic, glass, quartz, or silicon substrate.

Surface Treatment

The substrate 10 on which the source electrode 16 and the drain electrode 18 are disposed is washed with water and an organic solvent, and is subsequently subjected to surface treatment with oxygen plasma. Organic matter on the surfaces of the electrodes is removed by this surface treatment. The conditions of the surface treatment are controlled so that the substrate 10 has a higher surface roughness than the source and drain electrodes 16 and 18, by appropriately selecting an etching gas. Consequently, it becomes easy to bind an insulating underlayer formed in a subsequent operation to the surface of the substrate 10.

Forming Insulating Underlayer

Figure 3B:
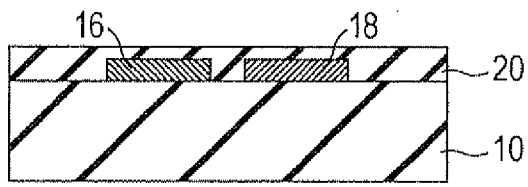

As shown in FIG. 3B, a nonpolar macromolecular material is dissolved in a solvent, and the nonpolar macromolecular solution is applied onto the substrate 10, the source electrode 16 and the drain electrode 18 by spin coating, followed by drying. The insulating underlayer 20 is thus formed. The thickness of the insulating underlayer 20 is several nanometers to several hundreds of nanometers, and preferably several nanometers to 50 nm. The macromolecular material of the insulating underlayer 20 and its solvent are the same as in the foregoing embodiment.

Applying Organic Semiconductor Material

Figure 3C:
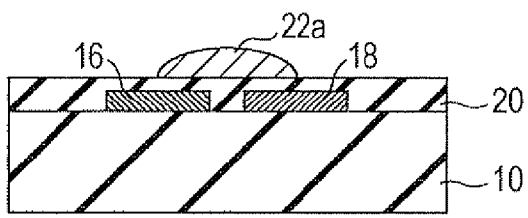

As shown in FIG. 3C, an organic semiconductor material solution 22a is applied to the channel region on the insulating underlayer 20 by an ink jet method. The organic semiconductor material solution 22a is deposited so as to overlap with the source electrode 16 and the drain electrode 18 when viewed from above. Since the insulating underlayer 20 is liquid-repellent, the organic semiconductor material solution 22a can be deposited with a large thickness. The organic semiconductor material and its solvent are the same as in the foregoing embodiment.

Forming Organic Semiconductor Layer

Figure 3D:
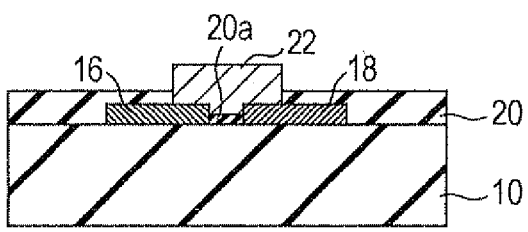

As shown in FIG. 3D, the insulating underlayer 20 is dissolved by the solvent of the organic semiconductor material solution 22a, and the weakly bound portions of the insulating underlayer 20 on the source and drain electrodes 16 and 18 are removed. Thus, the organic semiconductor material solution 22a comes into direct contact with the source electrode 16 and the drain electrode 18. Since the portion of the insulating underlayer 20 in the channel region between the source electrode 16 and the drain electrode 18 is firmly bound with the gate insulating layer 20, this portion remains as an insulating underlayer 20a. The organic semiconductor material solution 22a is dried to be solidified, thus forming the organic semiconductor layer 22. The organic semiconductor layer 22 overlaps with the source electrode 16 and the drain electrode 18, and fills the channel region over the insulating underlayer 20a between the source and drain electrodes 16 and 18. The thickness of the organic semiconductor layer 22 is several nanometers to several hundreds of nanometers. Preferably, it is about several tens of nanometers to 100 nm.

Forming Gate Insulating Layer

Figure 3E:
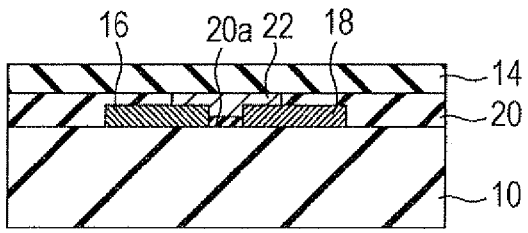

As shown in FIG. 3E, a gate insulating layer 14 is formed over the insulating underlayer 20 and the semiconductor layer 22. For example, a silicon oxide film is formed to a thickness of about 100 nm to several micrometers by chemical vapor deposition (CVD) of a silicon-based compound gas. If a low-temperature process is required, the gate insulating layer may be formed of an organic insulating material such as PMMA. In this instance, the organic insulating material can be selected from the above mentioned organic insulating materials.

If the surfaces of the insulating underlayer 20 and the semiconductor layer 22 are flush with each other as shown in FIG. 3E, they can be planarized by, for example, chemical mechanical polishing (CMP).

Forming Gate Electrode

Figure 3F:
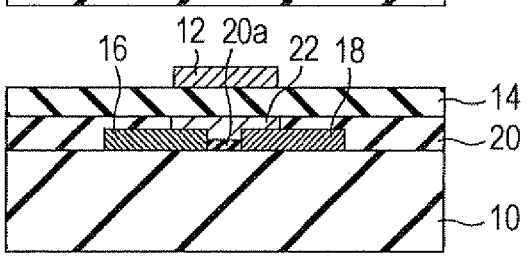

As shown in FIG. 3F, a gate electrode 12 and its wiring are formed on the gate insulating layer 14. The gate electrode 12 may be formed of an electroconductive polymer (electroconductive ink). For example, the gate electrode 12 may be formed by applying a solution of polyethylenedioxythiophene (PEDOT) in a solvent (water, an alcohol, or the like) onto the gate insulating layer by an ink jet method. The gate electrode 12 may be formed by applying a metal colloidal solution by an ink jet method and heat-treating the film of the colloidal solution.

Alternatively, the gate electrode 12 may be formed by vapor-depositing a metal, such as gold, or an alloy at a thickness of 10 nm to several micrometers on the gate insulating layer 14 and patterning the deposited film into the shape of the gate electrode.

Forming Protective Layer

Figure 3G:
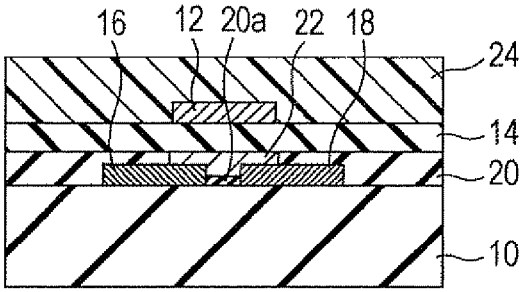

As shown in FIG. 3G, a protective layer 24 is formed of an organic insulating material such as PMMA over the insulating underlayer 14 and the semiconductor layer 12 by spin coating, and thus a transistor is completed.

In the second embodiment as well, by use of a solution of a semiconductor material, the insulating underlayer 20 is removed without etching being performed in another process step, and an organic semiconductor layer 22 is formed between the source electrode 16 and the drain electrode 18 (in the channel region). In this operation, the insulating underlayer 20a, that is, the portion of the insulating underlayer 20 on the substrate 10 (in the channel region), remains because the substrate 10 has a rough surface. The insulating underlayer (nonpolar macromolecular layer) 20a remaining in the channel region functions to stabilize the characteristics of the channel (transistor). Also, since the material of the insulating underlayer 20 is selected so that the surface of the insulating underlayer repels the organic semiconductor material solution 22a, the spreading of the organic semiconductor material solution 22a can be suppressed, and accordingly, the organic semiconductor layer 22 can be formed with a large thickness.

As described above, in the present embodiments, the insulating underlayer 20 suppresses the wetting and spreading of the semiconductor material solution. Consequently, fine, dense patterning can be performed. In addition, since the wetting and spreading of the semiconductor material solution is suppressed, the semiconductor layer can be formed to a larger thickness than in the case where the insulating underlayer has a high wettability. Thus, even in a case where a multilayer structure should be formed to increase the thickness, a thick single layer can be formed by reducing the wettability.

Furthermore, the wetting and spreading of the applied organic semiconductor material solution (ink) can be controlled independently of the material of the substrate 10. For example, even if the substrate has a high wettability, a dense pattern can be formed on the substrate by coating the substrate with a polymer film or insulating underlayer 20. Thus, the range of choices for the substrate can be increased.

Also, by coating the substrate with the insulating underlayer 20, the cleanness and surface state of the underlying source and drain electrodes 16 and 18 can be maintained.

By coating the source and drain electrodes 16 and 18 and their wiring with the insulating underlayer 20, leakage that may occur in the wiring can be prevented.

In the embodiments of the invention, a solvent that can dissolve the organic semiconductor material and the material of the insulating underlayer is used. In this instance, the solubility of the insulating underlayer material in the solvent may be as low as the solubility of polyethylene in xylene. The solubility may be to the extent that it is generally considered to be poor. Even if a solvent dissolves the insulating underlayer only to the extent that it is generally considered to be insoluble, for example, about 0.1% by weight, such a solvent may be used.

The insulating underlayer 20 is formed of a nonpolar macromolecular material. However, even if the material of the insulating underlayer 20 contains a functional group that is classified as a polar group by definition, the material may be considered to be an equivalent to nonpolar macromolecular materials, as long as the polarity of the functional group is so low as the characteristics of the transistor are substantially not affected. One of such materials is a fluorocarbon polymer. Fluorocarbons have polar groups such as the C—F bond, but the electrical polarization of their molecules is small. Fluorocarbons can form a surface having a low surface free energy (derived from dipole force, strength of hydrogen bond, dispersion force and the like), that is, a liquid-repellent surface. Exemplary fluorocarbon polymers include polytetrafluoroethylene (PTFE) such as "Teflon" (product name) of Du Pont and amorphous fluorocarbon resins such as "CYTOP" (product name) of Asahi Glass.

The organic transistor of the embodiments of the invention is suitably used in organic EL display devices and sensors including organic semiconductors.

What is claimed is:

1. A method for manufacturing an organic transistor, comprising:
    forming a source electrode and a drain electrode on an insulating substrate;
    forming an insulating underlayer of nonpolar macromolecular material over the substrate and the source and drain electrodes;
    forming an organic semiconductor layer between the source electrode and the drain electrode by applying an organic semiconductor material solution onto the insulating underlayer over the source electrode and the drain electrode and over a region of the insulating underlayer between the source electrode and the drain electrode, the organic semiconductor material solution containing a solvent that dissolves a portion of the insulating underlayer so that the organic semiconductor layer contacts the source electrode and the drain electrode;
    forming a gate insulating layer over the insulating underlayer and the organic semiconductor layer; and
    forming a gate electrode on the gate insulating layer corresponding to the region between the source electrode and the drain electrode.

2. The method according to claim 1, further comprising performing surface treatment to impart different surface roughnesses to the substrate and the source and drain electrodes so that the solvent can remove the portions of the insulating underlayer on the source and drain electrodes and allow the portion of the insulating underlayer between the source electrode and the drain electrode to remain, subsequent to the formation of the source and drain electrodes.

3. The method according to claim 1, further comprising, before the solvent dissolves the portion of the insulating underlayer, the portion of the insulating underlayer is disposed between the organic semiconductor layer and the gate and source electrodes.

4. A method for manufacturing an organic transistor, comprising:
    forming a source electrode and a drain electrode over an insulating substrate;
    forming an insulating underlayer of nonpolar macromolecular material over the substrate and the source and drain electrodes;
    forming an organic semiconductor layer between the source electrode and the drain electrode by applying an organic semiconductor material solution onto the insulating underlayer over the source electrode and the drain electrode and over a region of the insulating underlayer between the source electrode and the drain electrode, the organic semiconductor material solution containing a solvent that dissolves a portion of the insulating underlayer so that the organic semiconductor layer contacts the source electrode and the drain electrode; and
    forming an insulating layer over the insulating underlayer and the organic semiconductor layer.

5. The method according to claim 4, further comprising forming a gate electrode corresponding to the region between the source electrode and the drain electrode, and performing surface treatment to impart different surface roughnesses to the source and drain electrodes so that the solvent can remove the portions of the insulating underlayer on the source and drain electrodes and allow the portion of the insulating underlayer between the source electrode and the drain electrode to remain, subsequent to the forming of the source and drain electrodes.

* * * * *

UNITED STATES PATENT AND TRADEMARK OFFICE
CERTIFICATE OF CORRECTION

PATENT NO.         : 8,603,856 B2
APPLICATION NO.    : 13/090650
DATED              : December 10, 2013
INVENTOR(S)        : Kiyoshi Nakamura It is certified that error appears in the above-identified patent and that said Letters Patent is hereby corrected as shown below:

Title Page Item (73), please change "Seiko Eposon Corporation" to --Seiko Epson Corporation--.

Signed and Sealed this
First Day of July, 2014

Michelle K. Lee
*Deputy Director of the United States Patent and Trademark Office*